(12) United States Patent
Ma et al.

(10) Patent No.: US 11,349,107 B2
(45) Date of Patent: May 31, 2022

(54) DISPLAY SUBSTRATE, DISPLAY DEVICE, AND MANUFACTURING METHOD OF DISPLAY SUBSTRATE

(71) Applicants: MIANYANG BOE OPTOELECTRONICS TECHNOLOGY CO., Ltd, Sichuan (CN); BOE Technology Group Co., Ltd., Beijing (CN)

(72) Inventors: Qinglin Ma, Beijing (CN); Zhengping Xiong, Beijing (CN); Pohsuan Chiang, Beijing (CN); Yongan Feng, Beijing (CN); Shuaimin Jian, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 33 days.

(21) Appl. No.: 16/768,320

(22) PCT Filed: Dec. 25, 2019

(86) PCT No.: PCT/CN2019/128262
§ 371 (c)(1),
(2) Date: May 29, 2020

(87) PCT Pub. No.: WO2020/140804
PCT Pub. Date: Jul. 9, 2020

(65) Prior Publication Data
US 2021/0249636 A1    Aug. 12, 2021

(30) Foreign Application Priority Data
Jan. 2, 2019  (CN) .......................... 201910002691.1

(51) Int. Cl.
 H01L 51/56    (2006.01)
 H01L 27/32    (2006.01)
 H01L 51/00    (2006.01)
(52) U.S. Cl.
 CPC .......... *H01L 51/56* (2013.01); *H01L 27/3246* (2013.01); *H01L 27/3283* (2013.01); *H01L 51/0011* (2013.01)
(58) Field of Classification Search
 None
 See application file for complete search history.

(56) References Cited

U.S. PATENT DOCUMENTS

| | | | |
|---|---|---|---|
| 8,829,525 B2 | 9/2014 | Kim | |
| 10,326,097 B1* | 6/2019 | Xia | ........................ H01L 51/56 |
| 2016/0359112 A1* | 12/2016 | Wang | .................. H01L 27/3246 |

FOREIGN PATENT DOCUMENTS

| | | |
|---|---|---|
| CN | 104867963 A | 8/2015 |
| CN | 206250196 U | 6/2017 |
| CN | 109728053 A | 5/2019 |

OTHER PUBLICATIONS

First Office Action dated May 7, 2020, for corresponding Chinese application No. 201910002691.1.

(Continued)

*Primary Examiner* — Michelle Mandala
(74) *Attorney, Agent, or Firm* — Nath, Goldberg & Meyer; Joshua B. Goldberg

(57) ABSTRACT

The present disclosure provides a display substrate, a display device, and a manufacturing method of a display substrate. The display substrate of the present disclosure includes a substrate, a pixel defining layer located on the substrate, and a plurality of organic light emitting diodes arranged in an array, with a plurality of pixel accommodating holes provided in the pixel defining layer, and the organic light emitting diodes in one-to-one correspondence (Continued)

with the pixel accommodating holes, and located in the corresponding pixel accommodating holes; and a plurality of supporting structures in one-to-one correspondence with the pixel accommodating holes are formed on a side of the pixel defining layer distal to the substrate, and orthographic projections of the supporting structures on the pixel defining layer surround the corresponding pixel accommodating holes.

13 Claims, 2 Drawing Sheets

(56) References Cited

OTHER PUBLICATIONS

Second Office Action dated Nov. 3, 2020, for corresponding Chinese application No. 201910002691.1.

\* cited by examiner

DISPLAY SUBSTRATE, DISPLAY DEVICE, AND MANUFACTURING METHOD OF DISPLAY SUBSTRATE

CROSS-REFERENCE TO RELATED APPLICATION

This is a National Phase Application filed under 35 U.S.C. 371 as a national stage of PCT/CN2019/128262 filed on Dec. 25, 2019, an application claiming the priority of the Chinese patent application No. 201910002691.1 filed on Jan. 2, 2019, the contents of each which are incorporated herein in their entirety by reference.

TECHNICAL FIELD

The present disclosure relates to the field of display technology, and particularly to a display substrate, a display device and a manufacturing method of a display substrate.

BACKGROUND

In an organic light emitting diode display substrate, a plurality of pixel accommodating holes are formed in a pixel defining layer. Organic light emitting diodes are disposed in the pixel accommodating holes. An organic light emitting diode includes a first electrode, a second electrode, and an organic functional layer sandwiched therebetween. The organic functional layer includes a composite light-emitting layer, and preferably, may further include an electron transport layer, a hole transport layer, etc.

SUMMARY

The present disclosure provides a display substrate and a manufacturing method of a display substrate, and a display device.

A first aspect of the present disclosure provides a display substrate, including a substrate, a pixel defining layer located on the substrate, and a plurality of organic light emitting diodes arranged in an array, a plurality of pixel accommodating holes are provided in the pixel defining layer, and the organic light emitting diodes are in one-to-one correspondence with the pixel accommodating holes, and located in the corresponding pixel accommodating holes;

a plurality of supporting structures in one-to-one correspondence with the pixel accommodating holes are formed on a side of the pixel defining layer distal to the substrate, and orthographic projections of the supporting structures on the pixel defining layer surround the corresponding pixel accommodating holes.

Optionally, cross sections of the supporting structures, which are parallel to the substrate, are rectangular in shape.

Optionally, all the supporting structures are connected to form a grid.

Optionally, all the supporting structures are integrally formed as a single piece.

Optionally, cross sections of the supporting structures, which are parallel to the substrate, are round in shape.

A second aspect of the present disclosure provides a display device, including the display substrate provided by the first aspect of the present disclosure.

A Third Aspect of the Present Disclosure Provides a Manufacturing Method of Display Substrate, Including:

forming a pixel defining layer on a substrate, with a plurality of pixel accommodating holes formed in the pixel defining layer;

forming a plurality of supporting structures on a side of the pixel defining layer distal to the substrate, with the supporting structures in one-to-one correspondence with the pixel accommodating holes, and orthographic projections of the supporting structures on the pixel defining layer surrounding the corresponding pixel accommodating holes; and forming organic light emitting diodes on the substrate, with the organic light emitting diodes in one-to-one correspondence with the pixel accommodating holes, and located in the corresponding pixel accommodating holes.

Optionally, the steps of forming the pixel defining layer, forming the supporting structures and forming the organic light emitting diodes specifically include:

forming a plurality of first electrodes on a side of the substrate;

forming the pixel defining layer on the side of the substrate on which the first electrodes are formed, with the plurality of pixel accommodating holes formed in the pixel defining layer in one-to-one correspondence with the first electrodes, and each pixel accommodating hole exposing of at least part of the corresponding first electrode;

forming the plurality of supporting structures on the side of the pixel defining layer distal to the substrate, with the supporting structures in one-to-one correspondence with the pixel accommodating holes, and the orthographic projections of the supporting structures on the pixel defining layer surrounding the corresponding pixel accommodating holes;

forming a corresponding organic functional layer in each pixel accommodating hole by an evaporation process; and forming second electrodes on the sides of the organic functional layers distal to the substrate, with the first electrode, the organic functional layer and the second electrode in a same pixel accommodating hole forming an organic light emitting diode.

Optionally, cross sections of the supporting structures, which are parallel to the substrate, are rectangular in shape.

Optionally, all the supporting structures are connected to form a grid.

Optionally, all the supporting structures are integrally formed as a single piece.

DETAILED DESCRIPTION

In order to enable those skilled in the art to better understand the technical solutions of the present disclosure, the present disclosure is further described below in detail with reference to the accompanying drawings and specific embodiments.

In the present disclosure, "patterning process" refers to a step of forming a structure having a specific pattern, and may be a photolithography process including one or more steps of forming a material layer, coating photoresist, exposing, developing, etching, and stripping off the photoresist. The "patterning process" may alternatively be an imprinting process, an inkjet printing process, or other processes.

In general, in a method of manufacturing an organic light emitting diode display substrate, a first electrode of an organic light emitting diode is formed on a substrate, a pixel defining layer is then formed, and then an organic functional layer is formed by evaporation through an opening of an evaporation mask onto the first electrodes located in a pixel accommodating hole of the pixel defining layer. Since the evaporation mask is kept away from the pixel defining layer by a certain distance, a material evaporated into the pixel accommodating hole is likely to diffuse into an adjacent pixel accommodating hole, which results in poor color mixing of a final display.

Figure 1:
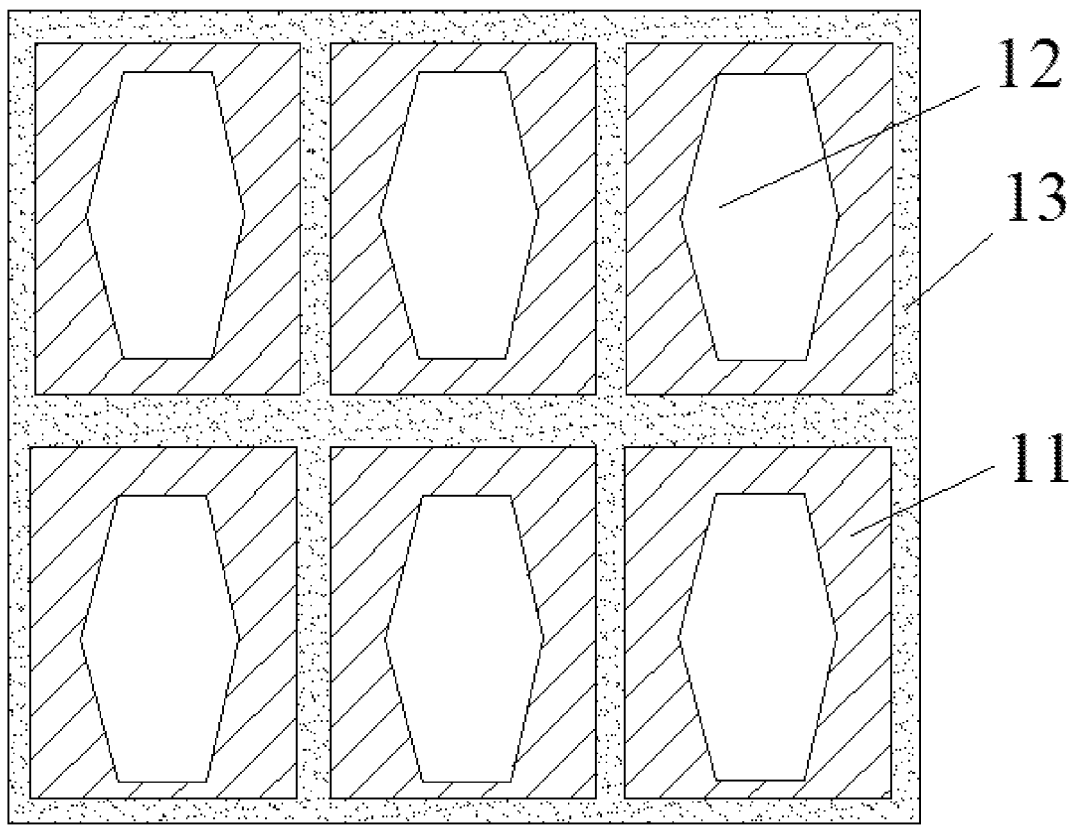
FIG. 1 is a top view of a part of a display substrate according to an embodiment of the present disclosure.
Figure 2:
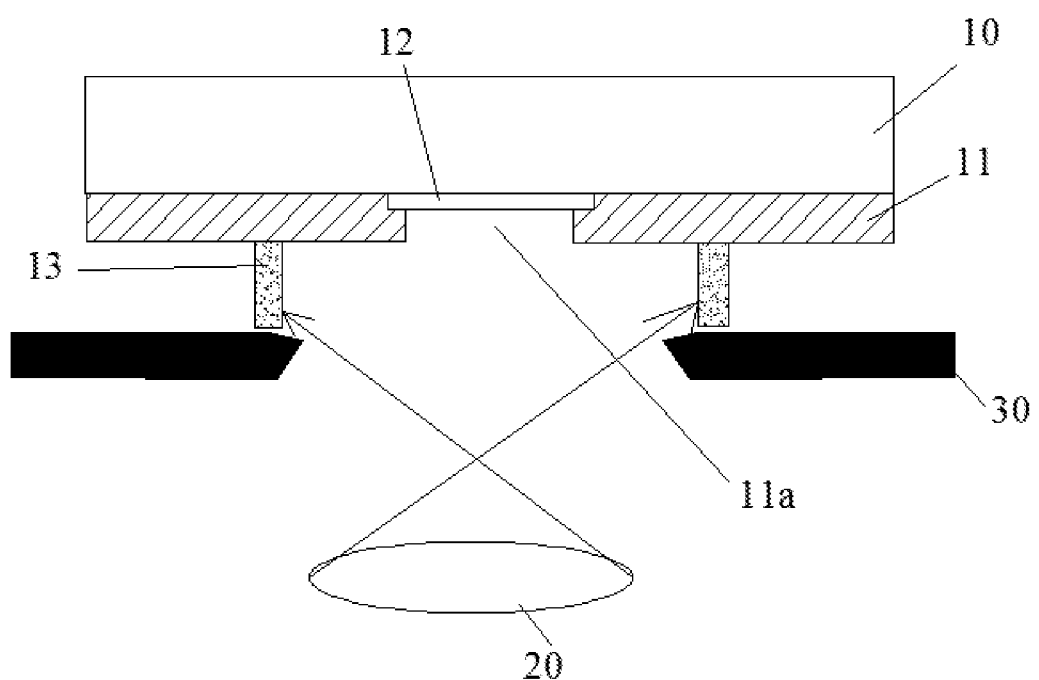
FIG. 2 is a schematic diagram of a manufacturing method of a display substrate according to an embodiment of the present disclosure.

An embodiment of the present disclosure provides a display substrate, including a substrate 10, a pixel defining layer 11 located on the substrate 10, and a plurality of organic light emitting diodes arranged in an array, a plurality of pixel accommodating holes 11a are provided in the pixel defining layer 11, and the organic light emitting diodes are in one-to-one correspondence with the pixel accommodating holes 11a, and located in the corresponding pixel accommodating holes 11a. As for the organic light emitting diodes, only first electrodes 12 thereof are shown in FIGS. 1 and 2.

A plurality of supporting structures 13 in one-to-one correspondence with the pixel accommodating holes 11a are formed on a side of the pixel defining layer 11 distal to the substrate 10, and orthographic projections of the supporting structures 13 on the pixel defining layer 11 surround the corresponding pixel accommodating holes 11a. With reference to FIG. 2, each supporting structure 13 is located at the periphery of the corresponding pixel accommodating hole 11a, so that the material of the organic functional layer (the arrows in FIG. 2 indicate motion traces of the material) is blocked by the supporting structure 13 and thus does not diffuse into the adjacent pixel accommodating holes 11a during the evaporation of the material of the organic functional layer of the organic light emitting diode, thereby avoiding poor color mixing.

Specifically, a material of the supporting structures 13 may be cured photoresist.

Optionally, cross sections of the supporting structures 13, which are parallel to the substrate 10, are rectangular in shape. The rectangular supporting structures 13 shown in FIG. 1 are connected together. However, the rectangular supporting structures 13 may be separated from one another in a practical application, that is, each independent rectangular supporting structure 13 corresponds to one pixel accommodating hole 11a.

It should be noted that the cross sections of the supporting structures 13, which are parallel to the substrate 10, may be in the shape of any closed pattern, such as a circle, a diamond, and a hexagon, and may be adjusted adaptively according to the shapes of the organic functional layers and an overall arrangement of the organic functional layers.

Optionally, all the supporting structures 13 are connected to form a grid, in which case the supporting structures 13 are formed from a plurality of first support bars and a plurality of second support bars, which intersect each other. The first support bars extend along a row direction, and the second support bars extend along a column direction. The included angle between the row direction and the column direction may be a right angle or an acute angle. In FIG. 1, the angle between the row direction and the column direction in the grid formed by the supporting structures 13 is a right angle.

Optionally, all the supporting structures 13 are integrally formed as a single piece. It should be noted that the supporting structures 13 may also be separated from one another.

The embodiments of the present disclosure further provide a display device, including the display substrate of the embodiments of the present disclosure.

Specifically, the display device may be any product or component having a display function, such as an organic light emitting diode (OLED) display panel, a mobile phone, a tablet computer, a television, a display, a notebook computer, a digital photo frame, and a navigator.

The embodiments of the present disclosure further provide a manufacturing method of a display substrate, including:

forming a pixel defining layer 11 on a substrate 10, with a plurality of pixel accommodating holes 11a formed in the pixel defining layer 11;

forming a plurality of supporting structures 13 on a side of the pixel defining layer 11 distal to the substrate 10, with the supporting structures 13 in one-to-one correspondence with the pixel accommodating holes 11a, and orthographic projections of the supporting structures 13 on the pixel defining layer 11 surrounding the corresponding pixel accommodating holes 11a; and forming organic light emitting diodes on the substrate 10, with the organic light emitting diodes in one-to-one correspondence with the pixel accommodating holes 11a, and located in the corresponding pixel accommodating holes 11a.

Since the orthographic projections of the supporting structures 13 on the pixel defining layer 11 surround the corresponding pixel accommodating holes 11a, each supporting structure 13 is located at the periphery of the corresponding pixel accommodating hole 11a as shown in FIG. 2, so that the material of the organic functional layers (the arrows in FIG. 2 indicate motion traces of the material) is blocked by the supporting structures 13 and thus does not diffuse into adjacent pixel accommodating holes 11a during the evaporation of the material of the organic functional layers of the organic light emitting diodes, thereby avoiding poor color mixing.

Optionally, cross sections of the supporting structures 13, which are parallel to the substrate 10, are rectangular in shape.

Optionally, all the supporting structures 13 are connected to form a grid.

Optionally, all the supporting structures 13 are integrally formed as a single piece.

As long as the supporting structure 13 can block the diffusion of the evaporation material in four directions parallel to the substrate 10, the specific shape of the supporting structure 13 may be those referred to by the above embodiments.

Optionally, the steps of forming the pixel defining layer 11, forming the supporting structures 13, and forming the organic light emitting diodes specifically include the following steps.

Firstly, a plurality of first electrodes 12 are formed on a side of the substrate 10.

Secondly, the pixel defining layer 11 is formed on the side of the substrate 10 on which the first electrodes 12 are formed, with the plurality of pixel accommodating holes 11a formed in the pixel defining layer 11 in one-to-one correspondence with the first electrodes, and each pixel accommodating hole 11a allowing exposure of at least part of the corresponding first electrode 12.

Thirdly, the plurality of supporting structures 13 are formed on the side of the pixel defining layer 11 distal to the substrate 10, with the supporting structures 13 in one-to-one correspondence with the pixel accommodating holes 11a, and the orthographic projections of the supporting structures 13 on the pixel defining layer 11 surrounding the corresponding pixel accommodating holes 11a.

Specifically, photoresist may be coated on the substrate 10, exposed and developed to remove the regions unnecessary for formation of the supporting structures 13, and the remaining photoresist forms the supporting structures 13.

Fourthly, a corresponding organic functional layer is formed in each pixel accommodating hole 11a by an evaporation process.

With reference to FIG. 2, after the material of the organic functional layer emitted by an evaporation source 20 passes through an opening of an evaporation mask 30, most of the material stays in an area defined by the pixel accommodating hole 11a, and a small amount of the material, which moves in inclined directions, is blocked by the supporting structure 13 and thus does not move into the adjacent pixel accommodating holes 11a, thereby avoiding poor color mixing.

Fifthly, second electrodes are formed on the side of the organic functional layers distal to the substrate 10, with the first electrode 12, the organic functional layer and the second electrode in the same pixel accommodating hole 11a forming an organic light emitting diode.

It should be understood that the above embodiments are merely exemplary embodiments employed to illustrate the principles of the present disclosure, and the present disclosure is not limited thereto. Without departing from the spirit and essence of the present disclosure, various changes and modifications may be made by those skilled in the art, and should be considered to fall within the scope of the present disclosure.

What is claimed is:

1. A display substrate, comprising a substrate, a pixel defining layer located on the substrate, and a plurality of organic light emitting diodes arranged in an array, with a plurality of pixel accommodating holes provided in the pixel defining layer, and the organic light emitting diodes in one-to-one correspondence with the pixel accommodating holes, and located in the corresponding pixel accommodating holes; wherein,
    a plurality of supporting structures in one-to-one correspondence with the pixel accommodating holes are formed on a side of the pixel defining layer distal to the substrate, and orthographic projections of the supporting structures on the pixel defining layer surround the corresponding pixel accommodating holes such that orthographic projections of the supporting structures on the pixel defining layer form a plurality of closed loops surrounding the corresponding pixel accommodating holes, wherein
    an orthographic projection of each of the plurality of closed loops on the pixel defining layer surrounds only one of the pixel accommodating holes and is spaced apart from this pixel accommodating hole by a distance which is larger than a width of the closed loops.

2. The display substrate of claim 1, wherein cross sections of the supporting structures, which are parallel to the substrate, are rectangular in shape.

3. The display substrate of claim 2, wherein all the supporting structures are connected to form a grid.

4. The display substrate of claim 3, wherein all the supporting structures are integrally formed as a single piece.

5. A display device, comprising the display substrate of claim 1.

6. A manufacturing method of display substrate, comprising:
    forming a pixel defining layer on a substrate, with a plurality of pixel accommodating holes formed in the pixel defining layer;
    forming a plurality of supporting structures on a side of the pixel defining layer distal to the substrate, with the supporting structures in one-to-one correspondence with the pixel accommodating holes, and orthographic projections of the supporting structures on the pixel defining layer surrounding the corresponding pixel accommodating holes; and
    forming organic light emitting diodes on the substrate, with the organic light emitting diodes in one-to-one correspondence with the pixel accommodating holes, and located in the corresponding pixel accommodating holes such that orthographic projections of the supporting structures on the pixel defining layer form a plurality of closed loops surrounding the corresponding pixel accommodating holes, wherein
    an orthographic projection of each of the plurality of closed loops on the pixel defining layer surrounds only one of the pixel accommodating holes and is spaced apart from the pixel accommodating hole by a distance which is larger than a width of the closed loops.

7. The manufacturing method of claim 6, wherein the steps of forming the pixel defining layer, forming the supporting structures and forming the organic light emitting diodes specifically comprise:
    forming a plurality of first electrodes on a side of the substrate;
    forming the pixel defining layer on the side of the substrate on which the first electrodes are formed, with the plurality of pixel accommodating holes formed in the pixel defining layer in one-to-one correspondence with the first electrodes, and each pixel accommodating hole exposing at least part of the corresponding first electrode;
    forming the plurality of supporting structures on the side of the pixel defining layer distal to the substrate, with the supporting structures in one-to-one correspondence with the pixel accommodating holes, and the orthographic projections of the supporting structures on the pixel defining layer surrounding the corresponding pixel accommodating holes;
    forming a corresponding organic functional layer in each pixel accommodating hole by an evaporation process; and
    forming second electrodes on the sides of the organic functional layers distal to the substrate, with the first electrode, the organic functional layer and the second electrode in a same pixel accommodating hole forming an organic light emitting diode.

8. The manufacturing method of claim 7, wherein cross sections of the supporting structures, which are parallel to the substrate, are rectangular in shape.

9. The manufacturing method of claim 8, wherein all the supporting structures are connected to form a grid.

10. The manufacturing method of claim 9, wherein all the supporting structures are integrally formed as a single piece.

11. The display device of claim 5, wherein cross sections of the supporting structures, which are parallel to the substrate, are rectangular in shape.

12. The display device of claim 11, wherein all the supporting structures are connected to form a grid.

13. The display device of claim 12, wherein all the supporting structures are integrally formed as a single piece.

* * * * *